(12) United States Patent
Kim

(10) Patent No.: US 7,256,122 B2
(45) Date of Patent: Aug. 14, 2007

(54) METHOD OF FABRICATING SEMICONDUCTOR DEVICE

(75) Inventor: Jung Joo Kim, Bucheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/027,851

(22) Filed: Dec. 29, 2004

(65) Prior Publication Data

US 2005/0142833 A1    Jun. 30, 2005

(30) Foreign Application Priority Data

Dec. 30, 2003   (KR)   ............... 10-2003-0100991

(51) Int. Cl.
*H01L 21/4763*  (2006.01)
*H01L 21/44*    (2006.01)

(52) U.S. Cl. ............... 438/629; 438/660; 438/669; 438/672; 438/675; 438/687

(58) Field of Classification Search ............... 438/629, 438/660, 669, 672, 675, 687
See application file for complete search history.

(56) References Cited

U.S. PATENT DOCUMENTS

| | | | |
|---|---|---|---|
| 5,953,615 A |   | 9/1999 | Yu |
| 6,015,747 A |   | 1/2000 | Lopatin et al. |
| 6,069,068 A | * | 5/2000 | Rathore et al. ............... 438/628 |
| 6,130,161 A | * | 10/2000 | Ashley et al. ............... 438/687 |
| 6,180,523 B1 |   | 1/2001 | Lee et al. |
| 6,194,279 B1 |   | 2/2001 | Chen et al. |
| 6,235,633 B1 |   | 5/2001 | Jang |
| 6,258,710 B1 | * | 7/2001 | Rathore et al. ............... 438/628 |
| 6,268,243 B1 |   | 7/2001 | Park |
| 6,287,954 B1 | * | 9/2001 | Ashley et al. ............... 438/622 |
| 6,316,306 B1 |   | 11/2001 | Park |
| 6,331,485 B1 |   | 12/2001 | Miyamoto |
| 6,348,731 B1 | * | 2/2002 | Ashley et al. ............... 257/751 |

(Continued)

FOREIGN PATENT DOCUMENTS

JP          4-127454         4/1992

(Continued)

OTHER PUBLICATIONS

Jung Joo Kim: Method of Fabricating Semiconductor Device; U.S. Appl. No. 11/027,839; Filed on Dec. 29, 2004: 18 Pages and 2 Drawing Sheets: Assignment DonghuAnam Semiconductor Inc.

(Continued)

*Primary Examiner*—Walter L. Lindsay, Jr.
(74) *Attorney, Agent, or Firm*—Andrew D. Fortney

(57) ABSTRACT

The present invention provides a Cu line and method of forming the same, by which reliability (e.g., EM, BTS and the like) can be enhanced by replacing SiN by $HfO_x$, which plays a role as a protective layer and/or an etch stop layer on a Cu line, prevents or inhibits galvanic corrosion due to Cu oxide, and inhibits or reduces additional formation of Cu oxide by gathering or scavenging oxygen atoms from —OH, $O_2$, and $H_2O$. The present method includes the steps of forming a trench in an insulating layer on a substrate, forming a planarized Cu layer in the trench, forming a $HfO_x$ layer on the planarized Cu layer, and thermally treating the substrate.

20 Claims, 2 Drawing Sheets

U.S. PATENT DOCUMENTS

| | | | |
|---|---|---|---|
| 6,461,914 B1 * | 10/2002 | Roberts et al. | 438/253 |
| 6,476,454 B2 * | 11/2002 | Suguro | 257/410 |
| 6,579,767 B2 | 6/2003 | Park et al. | |
| 6,583,021 B2 | 6/2003 | Song | |
| 6,607,958 B2 * | 8/2003 | Suguro | 438/287 |
| 6,750,541 B2 * | 6/2004 | Ohtsuka et al. | 257/750 |
| 6,764,899 B2 | 7/2004 | Yoon | |
| 6,838,352 B1 * | 1/2005 | Zhao | 438/386 |
| 6,869,871 B1 | 3/2005 | Choi | |
| 6,949,461 B2 | 9/2005 | Malhotra et al. | |
| 6,992,005 B2 * | 1/2006 | Ohtsuka et al. | 438/685 |
| 2001/0025999 A1 * | 10/2001 | Suguro | 257/410 |
| 2002/0006725 A1 | 1/2002 | Farrar | |
| 2002/0048931 A1 | 4/2002 | Farrar | |
| 2002/0158338 A1 * | 10/2002 | Ohtsuka et al. | 257/758 |
| 2002/0197844 A1 | 12/2002 | Johnson et al. | |
| 2003/0011043 A1 * | 1/2003 | Roberts et al. | 257/532 |
| 2003/0027393 A1 * | 2/2003 | Suguro | 438/287 |
| 2003/0096467 A1 | 5/2003 | Park et al. | |
| 2004/0087135 A1 * | 5/2004 | Canaperi et al. | 438/628 |
| 2004/0188839 A1 * | 9/2004 | Ohtsuka et al. | 257/750 |

FOREIGN PATENT DOCUMENTS

| | | |
|---|---|---|
| JP | 2001-274380 | 10/2001 |
| JP | 2002-367994 | 12/2002 |
| WO | WO 02/067318 A2 | 8/2002 |

OTHER PUBLICATIONS

Jung Joo Kim: Methods of Fabricating Via Hold and Trench; U.S. Appl. No. 11/027,435: Filed on Dec. 30, 2004; 10 Pages and 3 Drawing Sheets: Assignment DongbuAnam Semiconductor Inc.

Online Staff—Electronic News; NEC Claims Metal Gate Electrode, High-K Dielectric; Semiconductor International, Reed Electronics Group; Dec. 17, 2004, 1 page; 2004, Reed Business Information, Reed Elsevier Inc., www.reed-electronics.com.

Yoshihiko Toyoda and Takashi Mori: Semiconductor Device; Patent Abstracts of Japan; Publication No. 2002-387994; Publication Date: Dec. 20, 2002.

Kyaichi Suguro: Semiconductor Device and Manufacturing Method Thereof: Patent Abstracts of Japan: Publication No. 2001-274380; Publication Date: Oct. 5, 2001.

Takuyo Kato: Semiconductor Device: Patent Abstracts of Japan: Publication No. 04-127454; Publication Date: Apr. 28, 1992.

* cited by examiner

METHOD OF FABRICATING SEMICONDUCTOR DEVICE

This application claims the benefit of the Korean Application No. P2003-0100991 filed on Dec. 30, 2003, which is hereby incorporated by reference.

BACKGROUND OF THE INVENTION

1. Field of the Invention

The present invention relates to a semiconductor device and a method of fabricating the same, and more particularly, to a device having a damascene type Cu line protected by a $HfO_x$ layer and method of forming the same.

2. Discussion of the Related Art

Generally, Cu lines for metal wiring in semiconductor devices cannot be formed by RIE (reactive ion etching), unlike the popular aluminum metal lines. Such Cu lines are generally formed by the damascene method by designing a line layout, filling a via hole and trench with Cu, and planarizing the Cu. In doing so, SiN is typically deposited on a surface of the exposed Cu line after planarization, to be used as a diffusion barrier and etch stop layer. Hence, the surface of the final Cu line interfaces with SiN.

FIGS. 1A to 1C are cross-sectional diagrams for explaining a conventional method of forming a Cu line.

FIG. 1A shows a cross-sectional view of a Cu wire after completion of damascene and planarization processes. Referring to FIG. 1A, an insulating layer 11 is deposited on a substrate 10 provided with a prescribed device. Trenches and vias (not shown) are formed by a damascene process. The trench is filled with Cu, and the Cu is planarized to complete a Cu line 12.

FIG. 1B shows a cross-sectional view of a protective layer of SiN 13 deposited on the Cu line 12. Referring to FIG. 1B, after completion of damascene and planarization processes, a protective layer 13 is formed by depositing SiN 13 on the Cu line 12.

FIG. 1C shows a magnified cross-sectional view of a part-A in FIG. 1B for explaining a problem occurring at a Cu—SiN interface.

Referring to FIG. 1C, Cu oxide 14 is formed on a surface of the Cu line 12 after completion of planarizing the Cu line 12. Specifically, the Cu oxide 14 may be formed in the planarization process and in the subsequent transfer of the substrate to other equipment for SiN deposition after completion of the planarization process. However, the Cu oxide formed on the Cu line brings about various reliability problems in many processes. The substantial problems are explained as follows.

First of all, Cu oxide may degrade adhesion between SiN 13 and Cu 12. Cu oxide 14 between SiN 13 and Cu 12 makes the corresponding interface more unstable.

Secondly, different from Al oxide, the oxygen in Cu oxide 14 tends to migrate along Cu surfaces, thereby leading to corrosion of the Cu line 12 and any metal lines in physical contact therewith.

Thirdly, Cu oxide 14 may play a role as a negative electrode in galvanic corrosion.

Fourthly, the unstable interface between Cu 12 and SiN 13 due to the Cu oxide 14 accelerates interfacial diffusion of surface atoms that are most vulnerable to electro-migration (hereinafter abbreviated EM), leading to accelerated formation of voids.

Finally, the unstable interface causes unstable adhesion, whereby hillocks can be easily formed at the interface.

SUMMARY OF THE INVENTION

Accordingly, the present invention is directed to a Cu line and method of forming the same that substantially obviates one or more problems due to limitations and disadvantages of the related art.

An object of the present invention is to provide a Cu line and method of forming the same, which may enhance reliability (as generally determined by EM, bias thermal stress [BTS], and the like) by replacing SiN by $HfO_x$ (or inserting $HfO_x$ between Cu and SiN), which may playing a role as a protective layer or an etch stop layer on a Cu line, which may inhibit or prevent galvanic corrosion due to Cu oxide, and which may inhibit additional formation of Cu oxide by gathering or scavenging oxygen atoms from —OH, $O_2$, and $H_2O$.

Additional advantages, objects, and features of the invention will be set forth in part in the description which follows and in part will become apparent to those skilled in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method of fabricating a semiconductor device according to the present invention includes the steps of forming a trench pattern in an insulating layer on a substrate, forming a planarized Cu layer filling the trench pattern, forming a $HfO_x$ layer on the planarized Cu layer, and thermally treating (e.g., annealing) the substrate. The present device simply comprises an insulating layer on a substrate having a trench therein, a planar Cu layer in the trench, and a $HfO_x$ layer on the Cu layer.

Preferably, the method further includes the step of thermally treating (e.g., annealing) the $HfO_x$ layer and the planarized Cu layer.

In one embodiment, the $HfO_x$ layer forming step includes the steps of depositing Hf on the planarized Cu line and annealing the deposited Hf. Preferably, the annealing is carried out at a temperature of from 200 to about 700° C. in an atmosphere comprising oxygen or an oxygen/nitrogen mixture. More preferably, the (deposited) Hf has a thickness of from 50 to about 2,000 Å.

In an alternative embodiment, the $HfO_x$ layer is formed by directly depositing $HfO_x$ on the planarized Cu layer by chemical vapor deposition.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

In a method of fabricating a semiconductor device according to the present invention, after a Cu line has been formed, $HfO_x$ or Hf as a protective layer is deposited on the Cu line instead of or in addition to (e.g., under) SiN to reduce oxygen impurities at an interface between Cu and $HfO_x$, to inhibit or prevent possible corrosion by Cu oxide, and to enhance device reliability (e.g., as determined by EM, BTS, and the like).

Figure 1A:
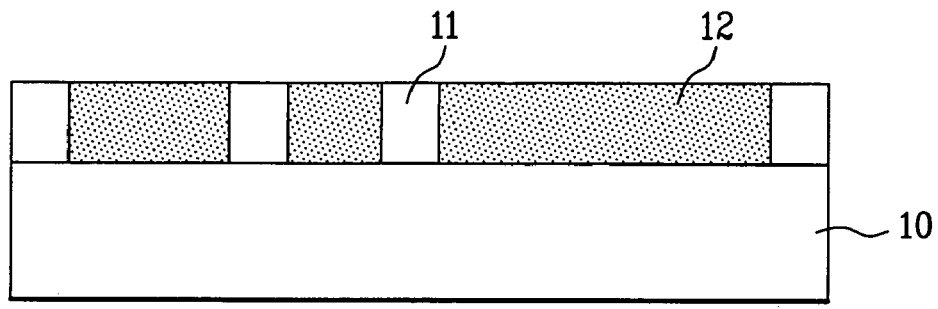
FIGS. 1A to 1C are cross-sectional diagrams for explaining a conventional method of forming a Cu line.
Figure 1B:
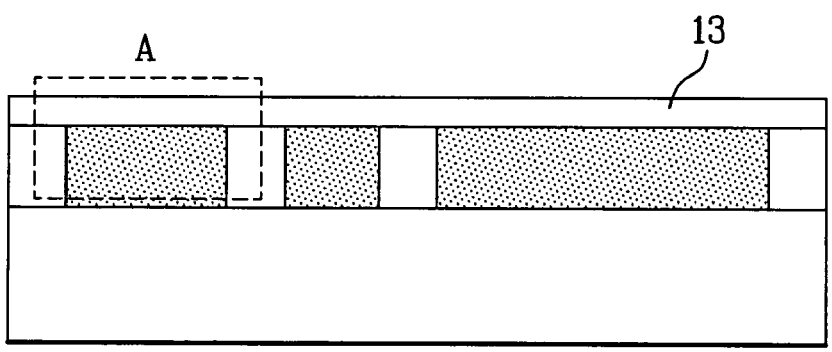
Figure 1C:
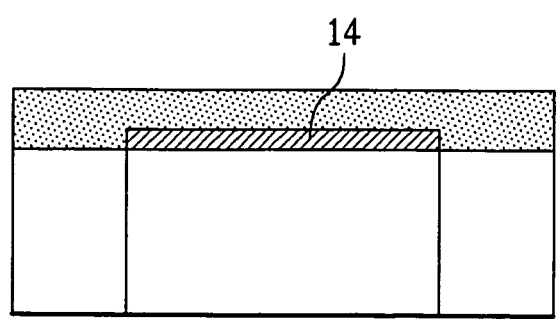
Figure 2A:
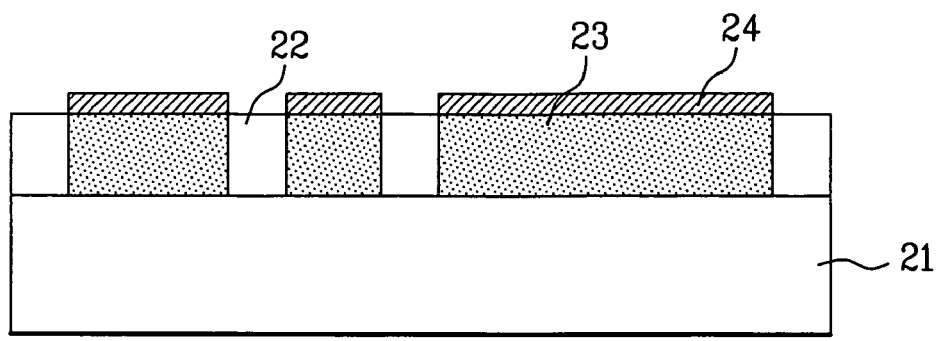
FIGS. 2A to 2C are cross-sectional diagrams for explaining a method of forming a Cu line according to the present invention.
Figure 2B:
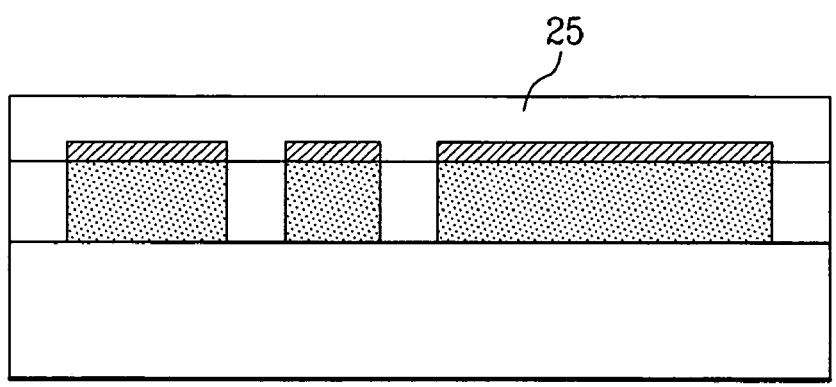
Figure 2C:
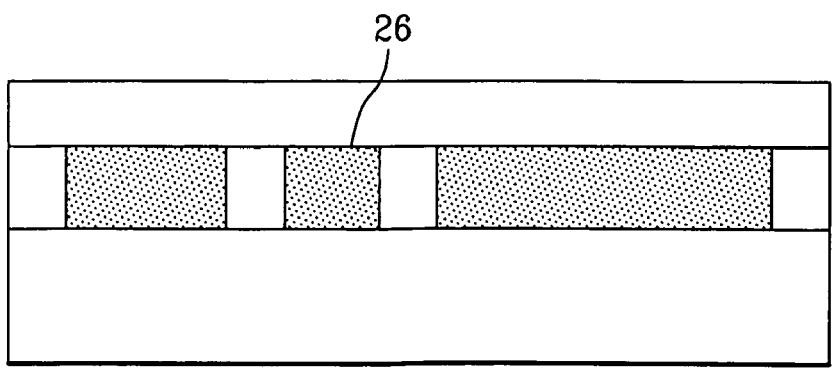

To solve the above problems, a Cu line is formed by a method shown in FIGS. 2A to 2C, which are cross-sectional diagrams for explaining a method of forming a Cu line according to the present invention.

FIG. 2A shows a cross-sectional view of a Cu wire after completion of damascene and planarization processes.

Referring to FIG. 2A, an insulating layer 22 is deposited on a substrate 21 provided with a prescribed device or devices. A trench for a Cu line is formed in the insulating layer 22 by a damascene process. Cu is deposited in the trench to fill up the trench. Then, the deposited Cu is planarized to complete a Cu line 23. In doing so, Cu oxide 24 may be easily formed during the planarization process and subsequent transfer of the substrate to different equipment for SiN deposition after completion of the planarization process.

FIG. 2B shows a step of forming $HfO_x$ on the Cu line formed by the damascene and planarization processes. In forming $HfO_x$, there are two variations as follows.

In a first variation, a protective layer 25 comprising Hf is blanket deposited on the substrate, including Cu line 23. After protective layer 25 comprising Hf metal has been deposited, the deposited Hf may be annealed at a temperature of from 200 to about 700° C. (preferably no more than about 600° C.) in an ambient comprising oxygen (and which may further comprise nitrogen and/or an inert, noble gas such as He, Ar or Ne) to form $HfO_x$. In doing so, Hf is preferably deposited to a thickness of from about 50 to about 2,000 Å. Following its oxygen-scavenging function, it is believed that annealing in the presence of oxygen (which may further contain, for example, nitrogen) forms a substantially continuous layer of $HfO_2$. Protective layer 25 may further contain a barrier or interface layer comprising silicon nitride (SiN) thereon.

In a second variation, a protective layer 25 comprising $HfO_x$ is directly deposited on the Cu line, generally by chemical vapor deposition (hereinafter abbreviated CVD) from a precursor such as $HfCl_4$, $Hf(O-t-Bu)_4$, or tetrakis(di-$C_1$–$C_4$-alkylamido)hafnium at a temperature similar to the annealing temperature of the first variation. If the precursor is other than $Hf(O-t-Bu)_4$ or other tetra($C_1$–$C_4$-alkoxy) hafnium, CVD may be conducted in an atmosphere containing oxygen source (such as $O_2$, $O_3$ or $N_2O$). If a process temperature of CVD is below 200° C., the step of forming protective layer 25 may further comprise thermal annealing (e.g., at a temperature of from 200 to about 700° C., in an atmosphere containing oxygen, nitrogen and/or an inert noble gas as described herein). As for the first variation, $HfO_x$-containing layer 25 may comprise or consist essentially of $HfO_2$, and/or may further contain a barrier or interface layer comprising silicon nitride (SiN) thereon.

Referring to FIG. 2C, the substrate is annealed or otherwise heated to an elevated temperature (e.g., from 200 to about 700° C.) so that Hf and/or $HfO_x$ can gather (or "scavenge") oxygen atoms of the Cu oxide, thereby reducing the $CuO_x$ to Cu and forming a substantially pure $HfO_x$/Cu interface 26.

Hence, in order to form the protective layer 25 on the Cu line formed in the course of a semiconductor wiring process, $HfO_x$ is formed either by depositing Hf metal and then annealing the Hf in oxygen (which may further contain nitrogen), or by directly depositing $HfO_x$ on the Cu line and then annealing the $HfO_x$. In such a manner, the Cu oxide component on the Cu line can be removed or reduced to Cu. For the removal or reduction of $CuO_x$ by Hf, the Gibbs energy of $HfO_2$ is (−)352 kJ/mol at 298K and the Gibbs energy of CuO is (−)297 kJ/mol at 298K. Hence, oxygen atoms of native $CuO_x$ may be gathered into or scavenged by the Hf in the protective layer 25 on the $CuO_x$ layer, whereby a clean surface 26 can be provided for the Cu line 23.

Accordingly, the present damascene Cu line and method of fabricating a semiconductor device have the following effects or advantages.

First of all, reliability (as determined by EM, BTS and the like) can be enhanced by replacing SiN by $HfO_x$, which plays a role as a protective layer or an etch stop layer on a Cu line. Secondly, galvanic corrosion due to Cu oxide can be reduced, inhibited or prevented. Finally, additional formation of Cu oxide can be inhibited by gathering or scavenging oxygen atoms from —OH, $O_2$, and $H_2O$.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method of fabricating a semiconductor device, comprising the steps of:
   forming a trench pattern in an insulating layer on a substrate;
   forming a planarized Cu layer in the trench pattern;
   depositing a protective layer comprising $HfO_2$ on the planarized Cu layer;
   depositing a barrier layer on the protective layer; and
   thermally treating the substrate.

2. The method of claim 1, wherein the barrier layer comprises silicon nitride.

3. The method of claim 1, wherein forming the trench pattern comprises a damascene process.

4. A method of fabricating a semiconductor device, comprising the steps of:
   forming a trench pattern in an insulating layer on a substrate;
   forming a planarized Cu layer in the trench pattern;
   depositing a protective layer comprising $HfO_2$ on the planarized Cu layer, and
   annealing the substrate at a temperature of from about 200 to about 700° C.

5. The method of claim 4, wherein the annealing is conducted in an atmosphere comprising oxygen, nitrogen and/or an inert noble gas.

6. The method of claim 5, wherein the annealing comprises an atmosphere comprising oxygen.

7. The method of claim 4, further comprising depositing a barrier layer on the protective layer.

8. The method of claim 7, wherein the barrier layer comprises silicon nitride.

9. A method of fabricating a semiconductor device, comprising the steps of:
   forming a trench pattern in an insulating layer on a substrate;
   forming a planarized Cu layer in the trench pattern;
   depositing a protective layer comprising $HfO_2$ on the planarized Cu layer by chemical vapor deposition; and
   thermally treating the substrate.

10. The method of claim 9, wherein the deposited $HfO_2$ has a thickness of from about 50 to about 2,000 Å.

11. The method of claim 3, further comprising depositing a barrier layer on the protective layer.

12. The method of claim 9, wherein the chemical vapor deposition comprises depositing the $HfO_2$ from a precursor selected from the group consisting of $HfCl_4$, tetra($C_1$–$C_4$-alkoxy)hafnium, and tetrakis(di-$C_1$–$C_4$-alkylamido)hafnium.

13. The method of claim 3, wherein forming the trench pattern comprises depositing Cu in the trench and planarizing the deposited Cu.

14. The method of claim 12, wherein the chemical vapor deposition comprises depositing the $HfO_2$ from a precursor selected from the group consisting of $HfCl_4$ and tetrakis(di-$C_1$–$C_4$-alkylamido)hafnium and an oxygen source selected from the group consisting of $O_2$, $O_3$, and $N_2O$.

15. The method of claim 3, wherein the chemical vapor deposition is conducted at a temperature of greater then 200° C.

16. The method of claim 9, wherein the chemical vapor deposition is conducted at a temperature of less than 200° C., and the method further comprises annealing the protective layer at a temperature of from 200 to about 700° C.

17. The method of claim 16, wherein the annealing is conducted in an atmosphere comprising oxygen, nitrogen and/or an inert noble gas.

18. A device, comprising:
   an insulating layer on a substrate, the insulating layer having a trench therein;
   a planar Cu layer in the trench;
   a protective layer comprising $HfO_2$ on the Cu layer; and
   a silicon nitride layer on the protective layer.

19. The device of claim 18, wherein the protective layer has a thickness of from about 50 to about 2,000 Å.

20. The device of claim 18, wherein the protective layer consists essentially of $HfO_2$.

* * * * *